United States Patent [19]
Ikada

[11] Patent Number: 6,057,744
[45] Date of Patent: May 2, 2000

[54] SURFACE ACOUSTIC WAVE DEVICE WITH MUTIPLE PASS BANDS

[75] Inventor: Katsuhiro Ikada, Kanazawa, Japan

[73] Assignee: Murata Manufacturing Co., Ltd., Japan

[21] Appl. No.: 09/056,273

[22] Filed: Apr. 7, 1998

[30] Foreign Application Priority Data

Apr. 10, 1997 [JP] Japan .................................. 9-092427
Mar. 17, 1998 [JP] Japan .................................. 10-066507

[51] Int. Cl.[7] .............................. H03H 7/46; H03H 9/64
[52] U.S. Cl. ............................................. 333/133; 333/195
[58] Field of Search ........................... 333/133, 193–196; 310/313 R, 313 B, 313 C, 313 D

[56] References Cited

U.S. PATENT DOCUMENTS

| | | | |
|---|---|---|---|
| 5,521,453 | 5/1996 | Yatsuda ................................ | 333/193 X |
| 5,694,096 | 12/1997 | Ushiroku et al. .................... | 333/193 X |
| 5,717,367 | 2/1998 | Murai ....................................... | 333/195 |
| 5,726,610 | 3/1998 | Allen et al. .......................... | 333/193 X |
| 5,864,262 | 1/1999 | Ikada ....................................... | 333/193 |

FOREIGN PATENT DOCUMENTS

| | | |
|---|---|---|
| 5-167388 | 2/1993 | Japan . |
| 7-66679 | 3/1995 | Japan . |

OTHER PUBLICATIONS

Ikada et al.; Proceedings of IEIC (The Institute of Electronics, Information, and Communication Engineers) General Conference–A–11–19, Mar. 24–27, 1997; "Low Loss Duel Band Saw Filter for PDC Makitori"; p. 294.

*Primary Examiner*—Robert Pascal
*Assistant Examiner*—Barbara Summons
*Attorney, Agent, or Firm*—Graham & James LLP

[57] ABSTRACT

A surface acoustic wave device includes first and second SAW filters and first, second and third SAW resonators. The first SAW filter has first and second ends and a first pass band in a first frequency region, and the second SAW filter has first and second ends and a second pass band in a second frequency region which is lower than the first frequency region. The second end of the second SAW filter is connected to the second end of the first SAW filter in parallel to form a connection point. The first and second one-port SAW resonators are connected in series between the second end of the first SAW filter and the connection point, and have an antiresonant frequency higher than the frequency of the pass band of the first SAW filter. The third one-port SAW resonator connected in series between the second end of the second SAW filter and the connection point and has an antiresonant frequency higher than the frequency of the pass band of the second SAW filter.

6 Claims, 17 Drawing Sheets

870 MHz
885 MHz
828 MHz
810 MHz

CHARACTERISTIC IMPEDANCE
$Z_0 = 50 \Omega$

870 MHz
885 MHz
828 MHz
810 MHz

CHARACTERISTIC IMPEDANCE
$Z_0 = 50 \Omega$

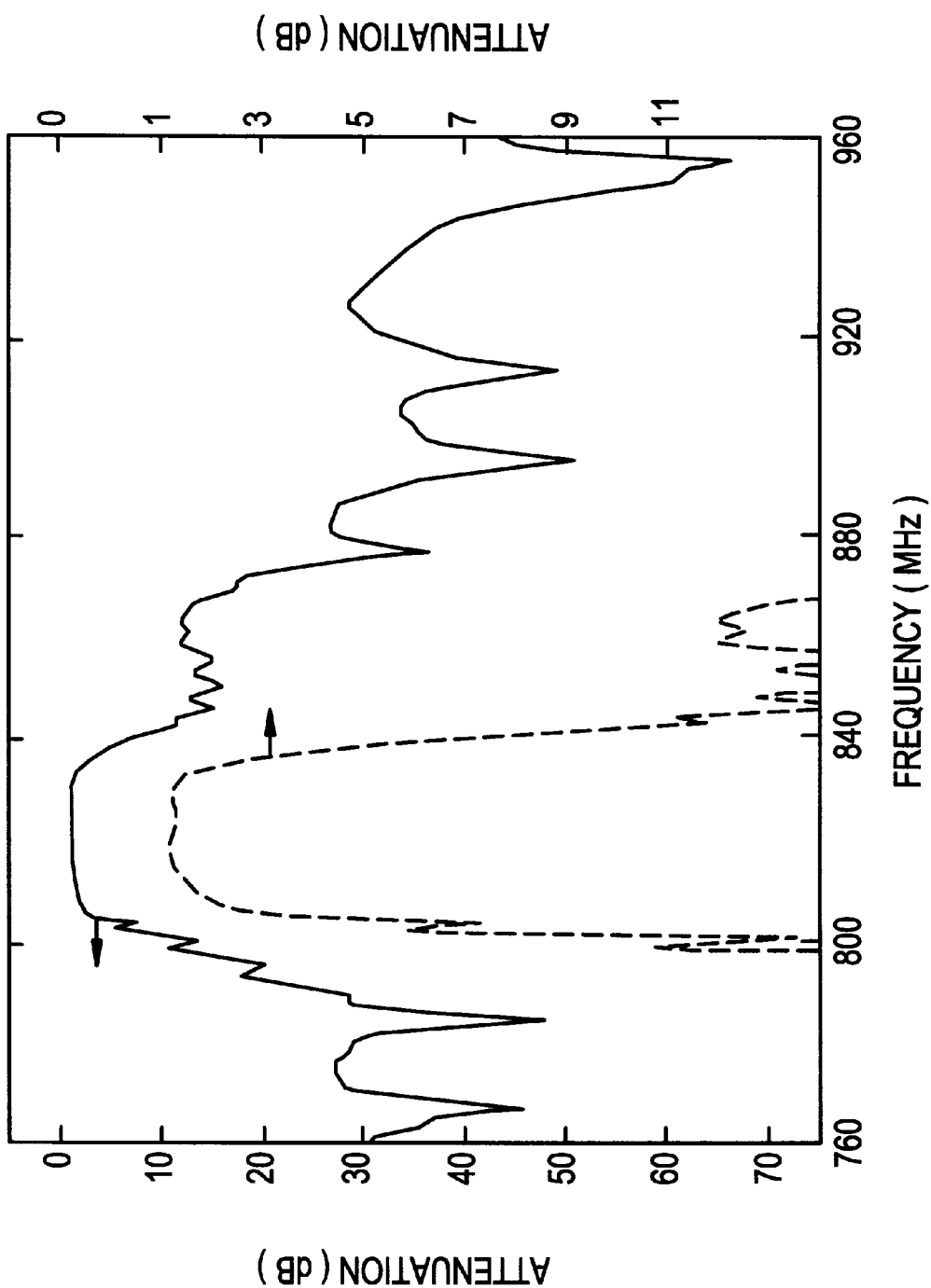

CHARACTERISTIC IMPEDANCE
$Z_0 = 50\,\Omega$

CHARACTERISTIC IMPEDANCE
$Z_0 = 50\,\Omega$

CHARACTERISTIC IMPEDANCE
$Z_0 = 50\Omega$

CHARACTERISTIC IMPEDANCE
$Z_0 = 50\Omega$

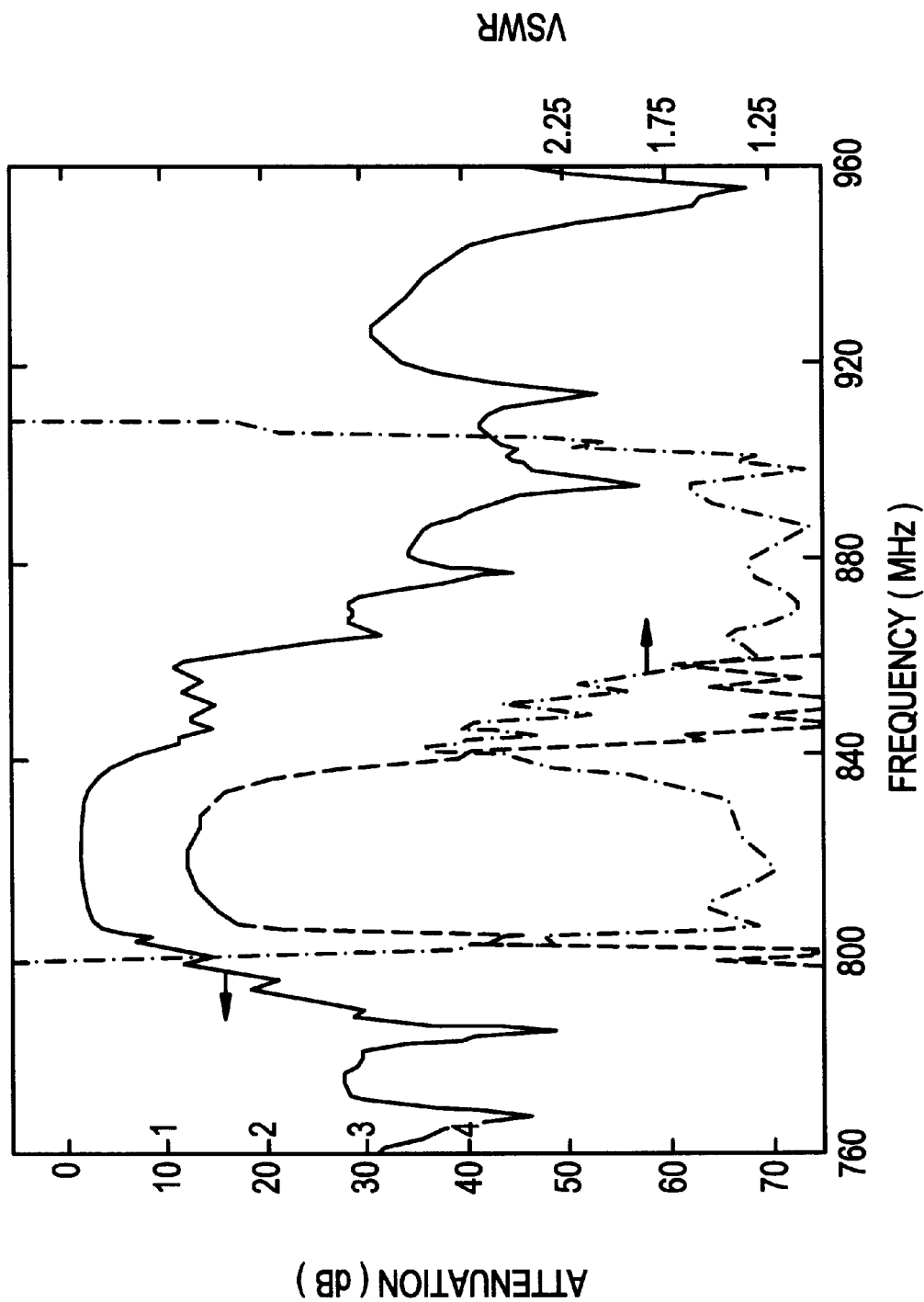

870 MHz
828 MHz
810 MHz
885 MHz

CHARACTERISTIC IMPEDANCE
$Z_0 = 50\Omega$

885 MHz
810 MHz
870 MHz
828 MHz

CHARACTERISTIC IMPEDANCE
$Z_0 = 50$

SURFACE ACOUSTIC WAVE DEVICE WITH MUTIPLE PASS BANDS

BACKGROUND OF THE INVENTION

1. Field of the Invention

The present invention relates to a surface acoustic wave device including a plurality of interconnected SAW filters, and more particularly to a surface acoustic wave device which is arranged to define a filter having two or more pass bands and is especially well suited for use in, for example, mobile communication devices or similar devices.

2. Description of the Related Art

In recent years, mobile communication devices have been required to be multi-functional. Thus, multi-band cellular phones having two or more communication systems have been developed. To provide a cellular phone having a plurality of communication systems, band-pass filters having two or more pass bands are necessary. However, it has been difficult to provide a single component which provides a filter having a plurality of communication systems which also achieves low insertion loss and a sufficiently wide band width.

For this reason, constructing a filter device having two or more pass bands achieved by combining a plurality of band-pass filters and making one component has been attempted.

For example, Japanese Laid-open Patent Publication No. 7-66679 discloses a diplexer made by combining a plurality of band pass filters. FIG. 1 schematically shows the construction of the diplexer 1.

As shown in FIG. 1, a first band-pass filter 2 having a pass band in a relatively high frequency region and a second band-pass filter 3 having a pass band in a relatively low frequency region are respectively connected to input ends $IN_1$, $IN_2$. The output ends of the first and second band-pass filters 2, 3 are connected at a connection point 4. At least the second band pass filter 3 is constructed using a SAW filter.

At least a one-port SAW resonator 5 is connected in series to the second band pass filter 3. The antiresonant frequency of the one-port SAW resonator 5 is located within the pass band of the first band-pass filter 2 or between the pass bands of the first and second band-pass filters 2 and 3. In addition, a transmission line 6 for impedance matching is connected in series to the first band-pass filter 2. By using the one-port SAW resonator 5, the attenuation on the high frequency side of the second band-pass filter 3 having a pass band in a relatively lower frequency region is increased. With such an arrangement, it is possible to simplify an external circuit for impedance matching on the second band pass filter 3 side.

Although the diplexer 1 is constructed as a single component, there is the problem that the overall size of the diplexer is too large since a large space is required to form a transmission line having a required electrical length. Also, in the case where the diplexer 1 is constructed in a package for use in a SAW device, the width of the transmission line 6 must be made very fine. As a result, the insertion loss may deteriorate due to resistance loss caused by the large length of the transmission line 6. In addition, the area or the height of the component package is exceedingly large, which causes an increase in cost and prevents miniaturization of an electronic device including such component.

FIG. 2 shows another example of a conventional filter device having two or more pass bands. The SAW device 11, disclosed in the Proceedings of the 1997 IEIC (Institute of Electronics, Information and Communication Engineers) General Conference, A-11-19, p. 294, includes a first SAW filter 12 with a pass band in a relatively high frequency region and a second SAW filter 13 with a pass band in a relatively low frequency region. The first and second SAW filters 12 and 13 are connected at a connection point 14 on the output side. Input ends $IN_1$, $IN_2$ and an output end OUT are also provided. Thus, the first and second SAW filters 12 and 13 are connected in parallel between the output end side connection point 14 and the input ends $IN_1$, $IN_2$. One-port SAW resonators 15 and 16 are connected in series between the first and second SAW filters 12 and 13 and the connection point 14, respectively. A capacitor 17 is connected in series between the one-port SAW resonator 15 and the connection point 14.

The one-port SAW resonator 15 and the capacitor 17, which are located at the output side terminal of the first SAW filter 12, are provided to increase the impedance of the other filter i.e. the second SAW filter 13. This prevents the insertion loss of the first and second SAW filters 12, 13 from deteriorating and enhances the amount of attenuation on the high frequency side of the pass band in the first SAW filter 12.

Although the first and second SAW filters 12 and 13, the one-port SAW resonators 15 and 16 and the capacitor 17 are disposed on a single piezoelectric substrate, the capacitor 17 requires a large area on the single piezoelectric substrate to obtain a sufficient static capacitance for achieving the above-mentioned effect. In addition, the capacitor 17 must be constructed so that there is no influence on the other SAW filter 13 on the same piezoelectric substrate, which results in a complicated arrangement of the SAW filters, resonators or the like. Consequently, although it is not necessary to use a transmission line for impedance matching, there is a limit to the ability to reduce the chip size of the surface acoustic wave device.

Also, when the capacitance of the capacitor 17 is decreased to reduce insertion loss of the second SAW filter 13, the VSWR (Voltage Standing Wave Ratio) in the pass band deteriorates.

SUMMARY OF THE INVENTION

To solve the problems described above, the preferred embodiments of the present invention provide a SAW device having two or more pass bands and which is constructed to have a compact body and excellent insertion loss and VSWR characteristics without having a transmission line for impedance matching.

According to a preferred embodiment of the present invention, a surface acoustic wave device includes first and second SAW filters and first, second and third SAW resonators. The first SAW filter has first and second ends and a first pass band in a first frequency region, and the second SAW filter has first and second ends and a second pass band in a second frequency region which is lower than the first frequency region. The second end of the second SAW filter is connected to the second end of the first SAW filter in parallel to form a connection point. The first and second one-port SAW resonators are connected in series between the second end of the first SAW filter and the connection point and have an antiresonant frequency higher than the frequency of the pass band of the first SAW filter. The third one-port SAW resonator is connected in series between the second end of the second SAW filter and the connection point and has an antiresonant frequency higher than the frequency of the pass band of the second SAW filter.

The first and second one-port SAW resonators preferably include interdigital transducers, respectively, and a wavelength of a surface acoustic wave excited by the interdigital transducer of the first one-port SAW resonator is preferably different from that excited by the interdigital transducer of the second one-port SAW resonator.

The first and second one-port SAW resonators may include a pair of reflectors having a plurality of electrode fingers, respectively, and the number of the electrode fingers of the first one-port SAW resonators is preferably different from the number of fingers of the second one-port SAW resonator.

The surface acoustic wave device may further comprise a single piezoelectric substrate, in which case the first and second SAW filters and the first, second and the third one-port SAW resonators are disposed on the single piezoelectric substrate.

For the purpose of illustrating the invention, there is shown in the drawings several forms and embodiments which are presently preferred. However, it should be understood that the present invention is not limited to the precise arrangements and instrumentalities shown.

BRIEF DESCRIPTION OF THE DRAWINGS

FIG. 8 is a graph showing the frequency-amplitude characteristic of a second SAW filter in the preferred embodiment shown in FIG. 3.

FIG. 13 is a graph showing frequency-amplitude characteristic and VSWR of a second SAW filter side in the surface acoustic wave device of the preferred embodiment shown in FIG. 3.

DETAILED DESCRIPTION OF PREFERRED EMBODIMENTS

Hereinafter, the preferred embodiments of the present invention are explained in detail with reference to the drawings.

Figure 3:
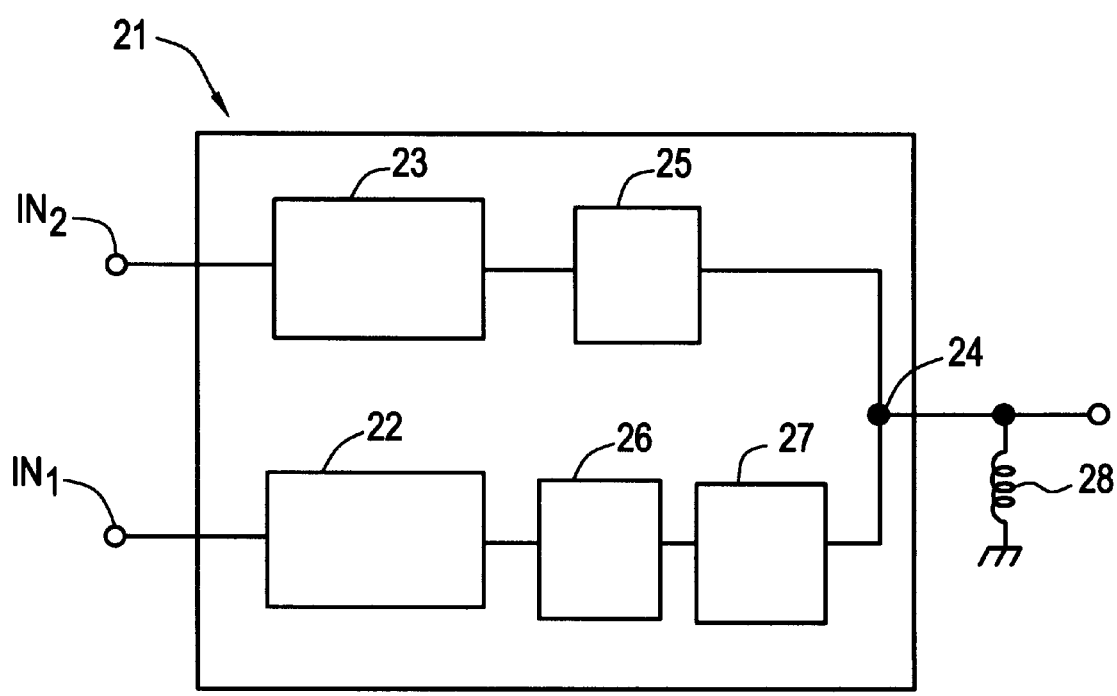
FIG. 3 is a circuit diagram of a surface acoustic wave device according to a preferred embodiment of the present invention.

FIG. 3 is a circuit diagram of a surface acoustic wave device pertaining to a preferred embodiment of the present invention. The surface acoustic wave device 21 has a structure and arrangement wherein a first SAW filter 22 and a second SAW filter 23 having different pass bands are connected at their respective output sides at a connection point 24. More, specifically, the first SAW filter 22 having a pass band in a first frequency region is connected to an input end $IN_1$ and a second SAW filter 23 having a pass band in a second frequency region lower than the first frequency region is connected to an input end $IN_2$.

A first one-port SAW resonator 26 and a second one-port SAW resonator 27 are connected in series between the first SAW filter 22 and the connection point 24. The one-port SAW resonators 26 and 27 have antiresonant frequencies higher than the pass band of the first SAW filter 22. The one-port SAW resonators 26 and 27 preferably have the same frequency characteristics. Similarly, a third one-port SAW filter 25 is connected in series between the second SAW filter 23 and the connection point 24. The one-port SAW resonator 25 also has an antiresonant frequency higher than the pass band of the second SAW filter 23.

Figure 4:
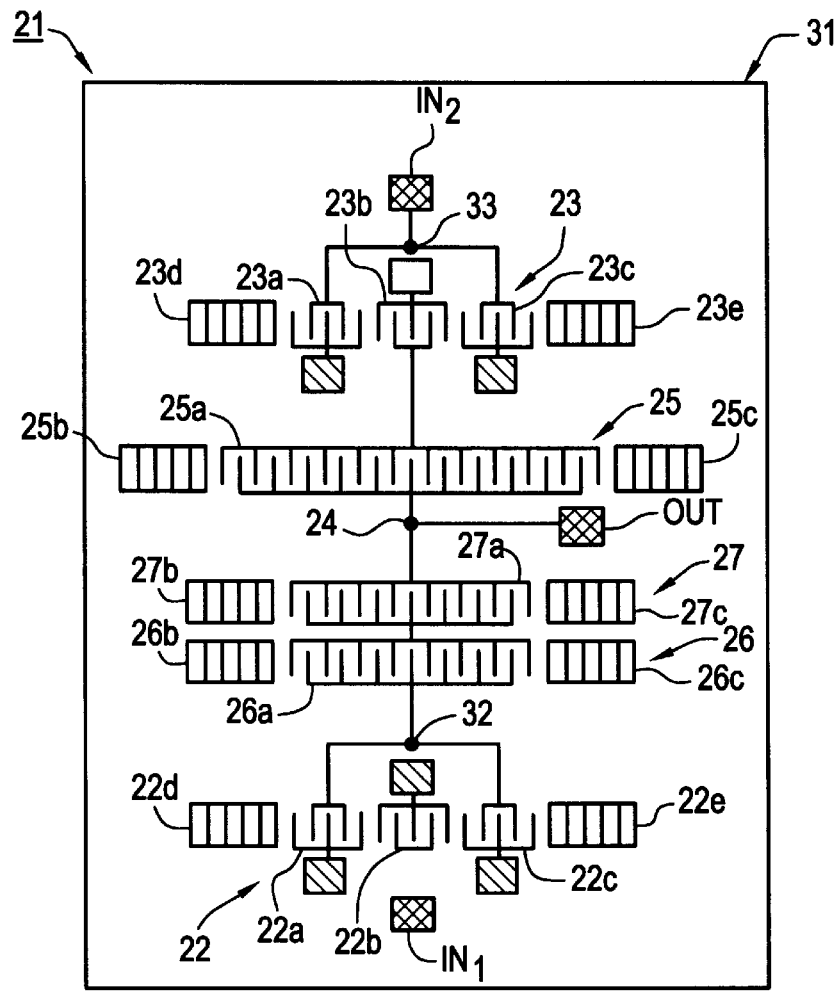
FIG. 4 is a schematic plan view showing an example of specific structure of a surface acoustic wave device according to the preferred embodiment shown in FIG. 3.
Figure 5:
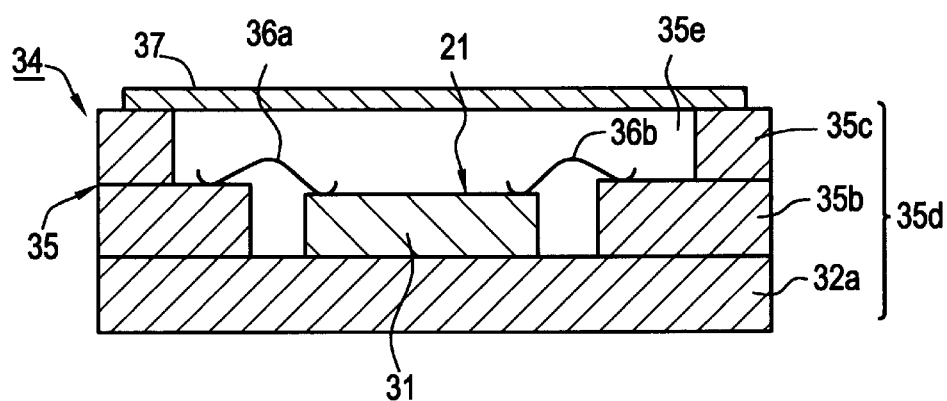
FIG. 5 is a sectional view illustrating a structure wherein the surface acoustic wave device shown in FIG. 4 is disposed in a package.

FIG. 4 is a schematic plan view showing a specific construction of a surface acoustic wave device according to a preferred embodiment of the present invention, and FIG. 5 is a cross-sectional view showing a package in which the surface acoustic wave device shown in FIG. 4 is encased.

As shown in FIG. 4, the surface acoustic wave device 21 includes a substantially rectangular piezoelectric substrate 31. The piezoelectric substrate 31 can be made of a piezoelectric ceramic such as a lead zirconate titanate ceramic, or a piezoelectric single crystal such as quartz, $LiTaO_3$, $LiNbO_3$. In one example of this preferred embodiment, the piezoelectric substrate 31 is preferably made of a 36° Y-X $LiTaO_3$ substrate.

The input terminals $IN_1$ and $IN_2$ are disposed on the piezoelectric substrate 31 by forming a conductive film, and the first SAW filter 22 is connected to the input terminal $IN_1$. More specifically, the first SAW filter 22 has three interdigital transducers (IDTs) 22a through 22c. One comb-shaped electrode of the IDT 22b located at the center among the IDTs 22a to 22c is connected to the input terminal $IN_1$, and the other comb-shaped electrode of the IDT 22b is grounded. One comb-shaped electrode of each of the IDTs 22a and 22c is grounded, and the other comb-shaped electrode is connected to a connection point 32. Reflectors 22d and 22e are provided at both surface wave propagation direction sides of the region in which the IDTs 22a through 22c are located.

The second SAW filter 23 is connected to the input terminal $IN_2$. The second SAW filter 23 also has three IDTs 23a through 23c. One comb-shaped electrode of the IDT 23b located at the center among the IDTs 23a to 23c is grounded, and the other comb-shaped electrode of the IDT 23b is connected to the SAW resonator 25. One comb-shaped electrode of each of the IDTs 23a and 23c is grounded and the other comb-shaped electrode is connected to a connection point 33. The connection point 33 is connected to the input terminal $IN_2$. Reflectors 23d and 23e are disposed on both surface wave propagation direction sides of the region at which the IDTs 23a through 23c are located.

The one-port SAW resonators 26 and 27 are connected in series between the connection point 32 and the connection point 24. The one-port SAW resonator 26 has an IDT 26a and reflectors 26b and 26c disposed on both surface wave propagation direction sides of the IDT 26a. Similarly, the one-port SAW resonator 27 has an IDT 27a and reflectors 27b and 27c disposed on both sides of the IDT 27a. One end of the one-port SAW resonator 26 is connected to the connection point 32 and one end of the one-port SAW resonator 27 is connected to the connection point 24.

Also, between one comb-shaped electrode of the IDT 23b of the second SAW filter 23 and the connection point 24, the one-port SAW resonator 25 is connected. The one-port SAW resonator has an IDT 25a disposed in the center and reflectors 25b, 25c disposed on both sides thereof. The connection point 24 is connected to an output terminal OUT.

The first and second SAW filters 22 and 23, the one-port SAW resonators 25 through 27, the input terminals $IN_1$ and $IN_2$ and the output terminal OUT provided on the piezoelectric substrate 31 are all preferably formed by patterning a conductive material such as Al on the piezoelectric substrate 31.

In this way, by constructing the elements of the preferred embodiment described above on a single piezoelectric substrate 31, it is possible to easily achieve miniaturization of a surface acoustic wave device 21 having a plurality of pass bands. Also, because it is possible to form the various electrodes simultaneously by patterning a conductive material such as Al on the piezoelectric substrate 31, the manufacturing process is greatly facilitated. Accordingly, the manufacturing cost is significantly reduced.

As shown in FIG. 5, the surface acoustic wave device 21 can be disposed in a package in the same way as an ordinary surface acoustic wave filter. The surface acoustic wave device 21 is provided inside a package 35 preferably made of an insulating ceramic, thereby being incorporated into a chip or component 34. The package 35 has a main body 35d which is preferably constructed by stacking substantially rectangular frame members 35b and 35c on a ceramic substrate 35a made of an insulating ceramic. The surface acoustic wave device 21 is disposed inside an opening 35e of the main body 35d, and is fixed to the ceramic substrate 35a. The input terminals $IN_1$ and $IN_2$, the output terminal OUT and the electrodes to be connected to ground potential (the electrodes being shown via diagonal line hatching in FIG. 4) of the surface acoustic wave device 21 are electrically connected by bonding wires 36a, 36b or the like to electrodes for connection to an external component. The opening 35e is closed by a cover member 37 which is preferably made of metal.

As is clear from FIG. 5, the surface acoustic wave device 21 of this preferred embodiment can be constructed as an in-package type electronic component in the same way as an ordinary surface acoustic wave device by using a package 35 which is constructed for packaging a conventional surface acoustic wave device.

Hereinafter, the characteristics of the surface acoustic wave device 21 will be explained with reference to frequency-amplitude characteristics and impedance characteristics.

Figure 6:
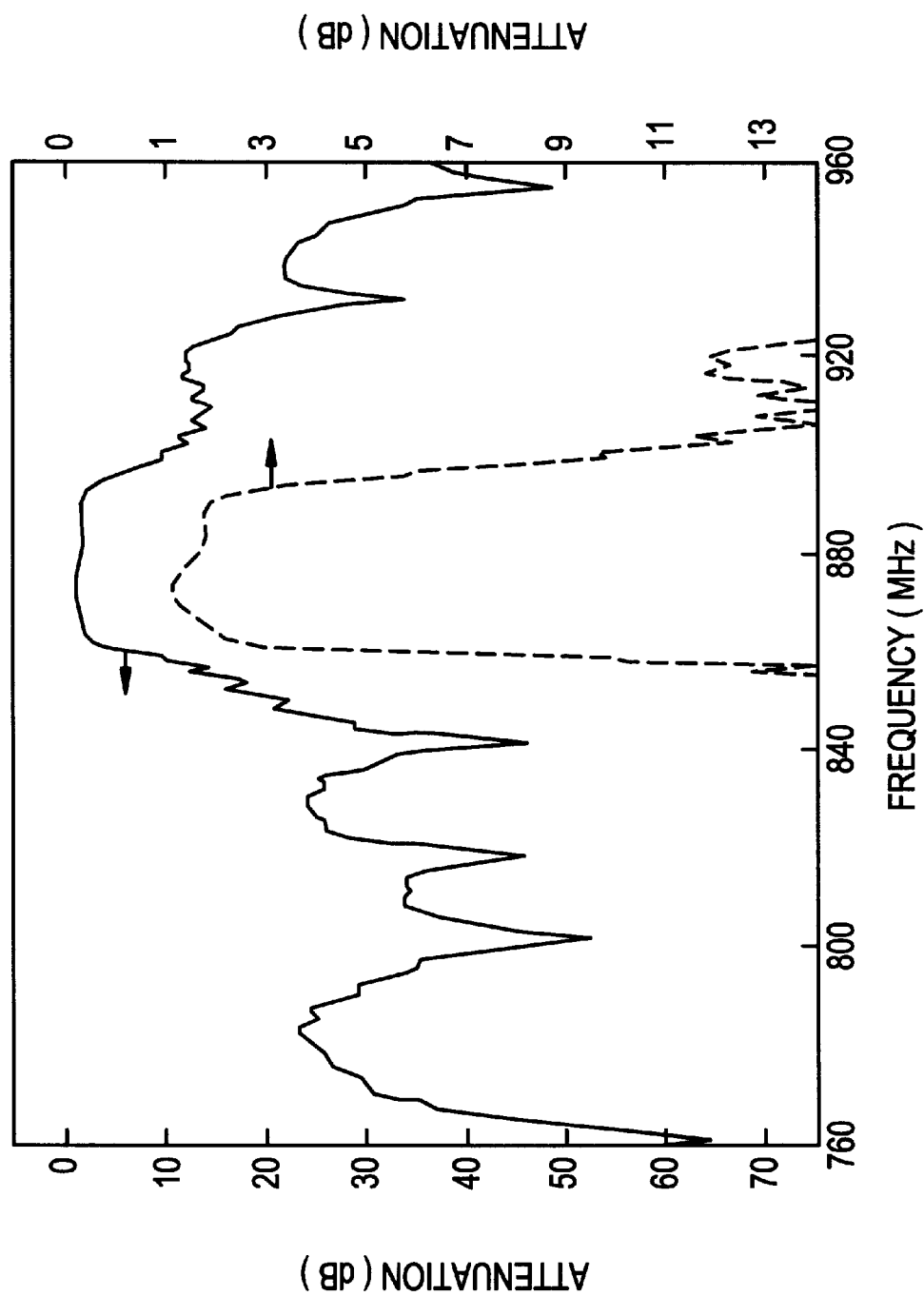
FIG. 6 is a graph showing the frequency-amplitude characteristic of a first SAW filter according to the preferred embodiment shown in FIG. 3.
Figure 7A:
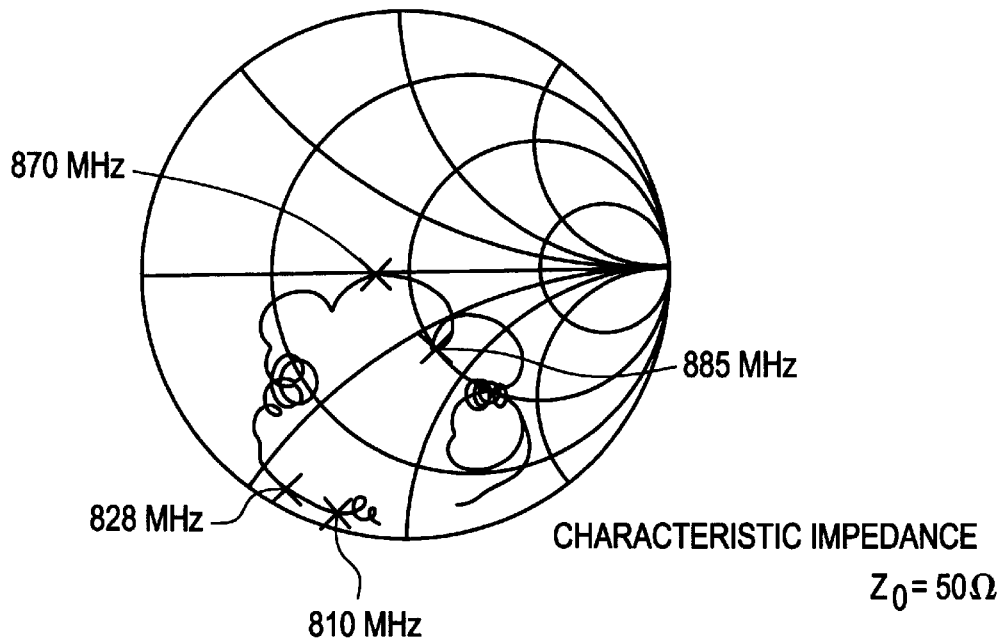
FIG. 7A is an impedance Smith chart for an input side of the first SAW filter in the preferred embodiment shown in FIG. 3.
Figure 7B:
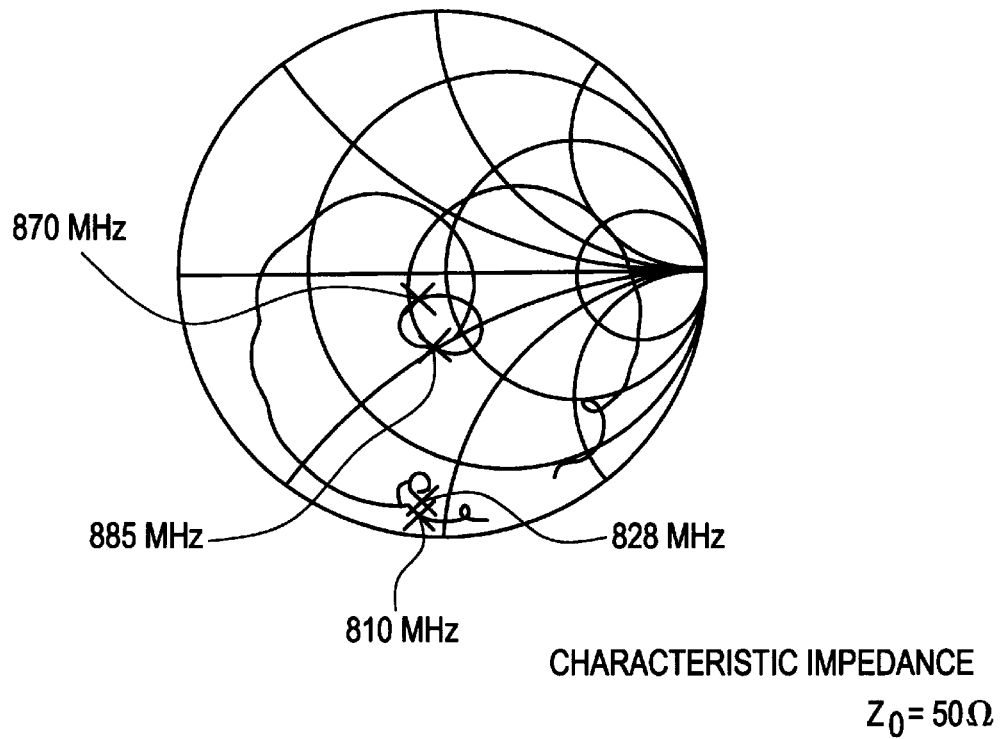
FIG. 7B is an impedance Smith chart for an output side of the first SAW filter in the preferred embodiment shown in FIG. 3.

In one example of preferred embodiments of the present invention, the pass band of the first SAW filter 22 is preferably from about 870 to about 885 MHz, and the frequency-amplitude characteristic in the vicinity of the pass band of the first SAW filter 22 is shown in FIG. 6. FIGS. 7A and 7B show impedance Smith charts for the input side and the output side respectively of the first SAW filter 22.

Figure 9A:
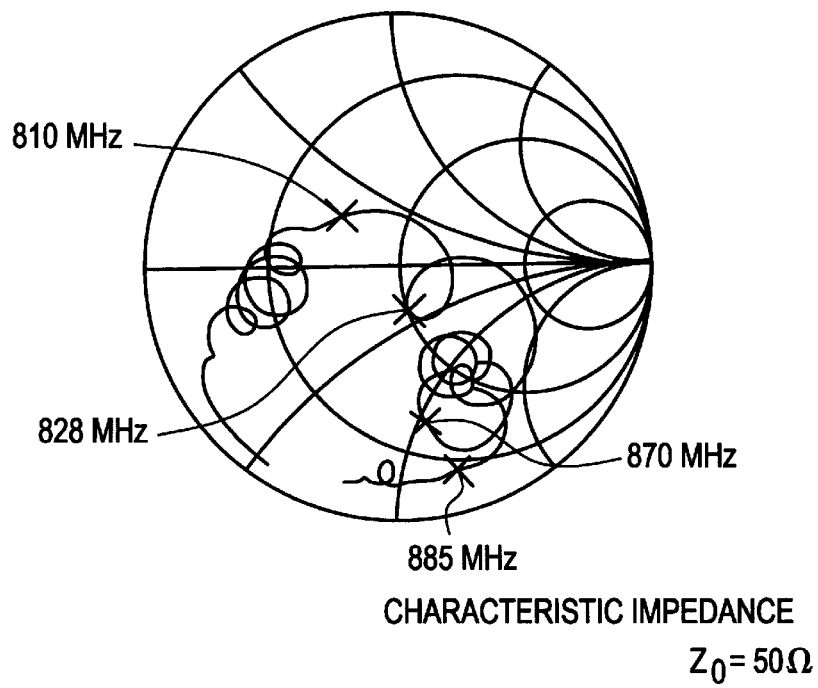
FIG. 9A is an impedance Smith chart for an input side of the second SAW filter in the preferred embodiment shown in FIG. 3.
Figure 9B:
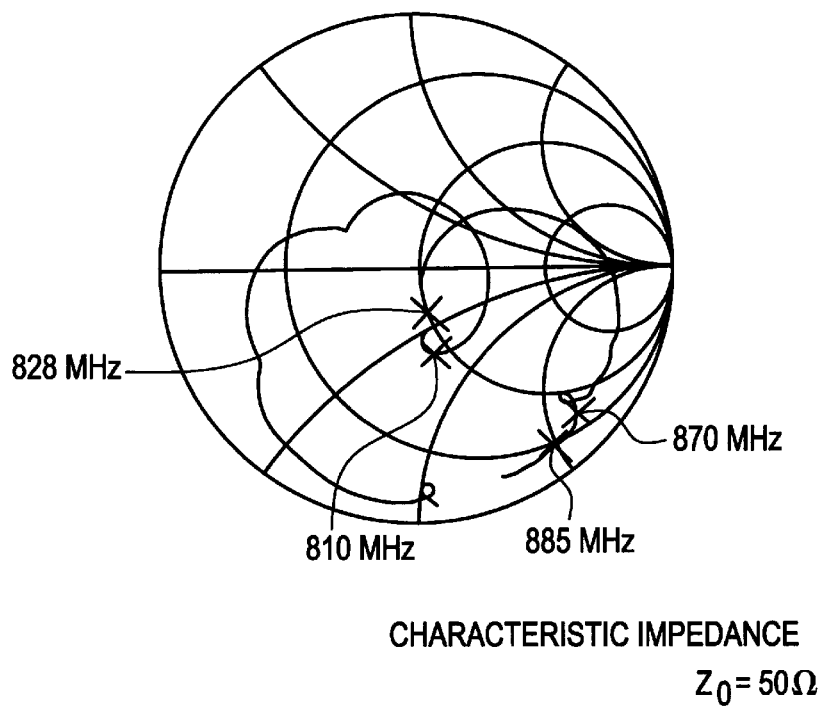
FIG. 9B is an impedance Smith chart for an output side of the second SAW filter in the preferred embodiment shown in FIG. 3.

The band pass of the second SAW filter 23 is preferably about 810 to about 828 MHz, and the frequency-amplitude characteristic in the vicinity of the pass band of the second SAW filter 23 is shown in FIG. 8. FIGS. 9A and 9B show impedance Smith charts for the input side and the output side respectively of the second SAW filter 23.

Figure 10:
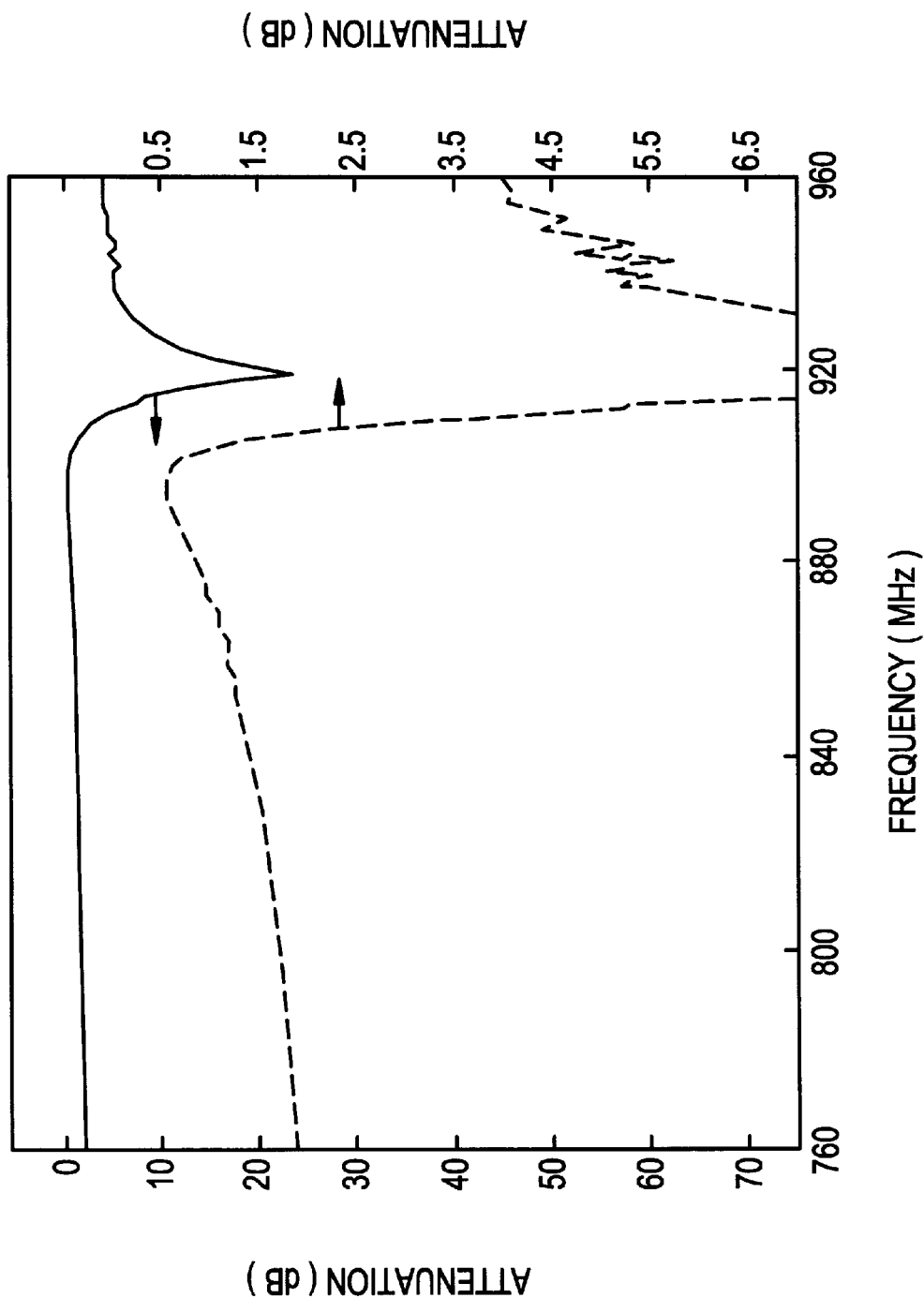
FIG. 10 is a graph showing the frequency-amplitude characteristic of a first one-port SAW resonator in the preferred embodiment shown in FIG. 3.

The one-port SAW resonator 26 and the one-port SAW resonator 27 are similarly constructed, and the frequency-amplitude characteristic of the one-port SAW resonator 26 is shown representatively in FIG. 10.

Figure 11:
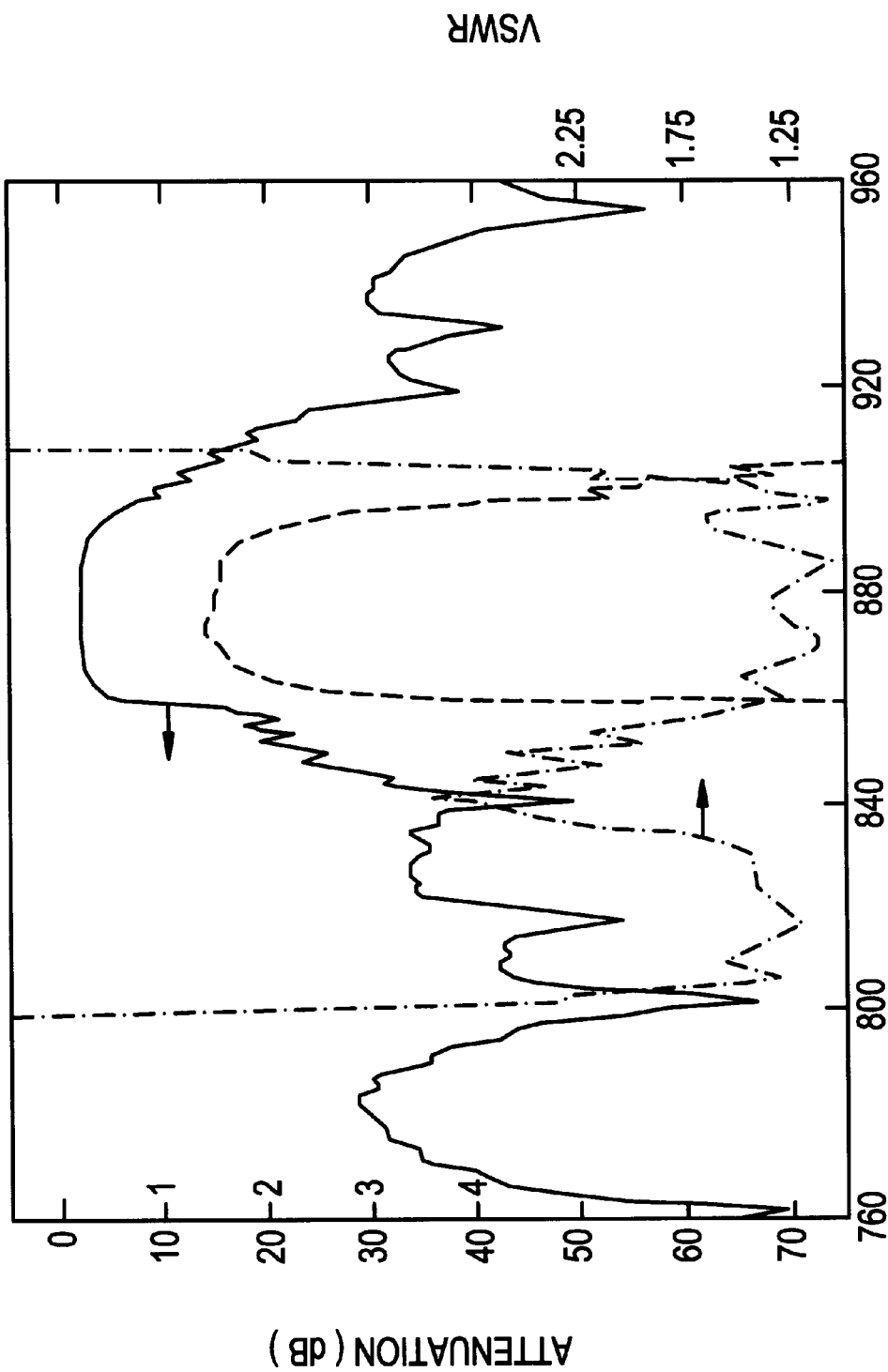
FIG. 11 is a graph showing a frequency-amplitude characteristic and VSWR on the first SAW filter 22 side in the preferred embodiment shown in FIG. 3.

FIG. 11 shows the frequency-amplitude characteristic and VSWR in the vicinity of the pass band on the first SAW filter 22 side in this preferred embodiment, wherein the one-port SAW resonators 26 and 27 are connected to the first SAW filter 22 in series as shown in FIG. 3. A 10 nH inductance device for impedance matching 28 is preferably connected between the connection point 24 and ground. Also, the input side of the second SAW filter 23 is terminated with 50Ω resistance.

Figure 12A:
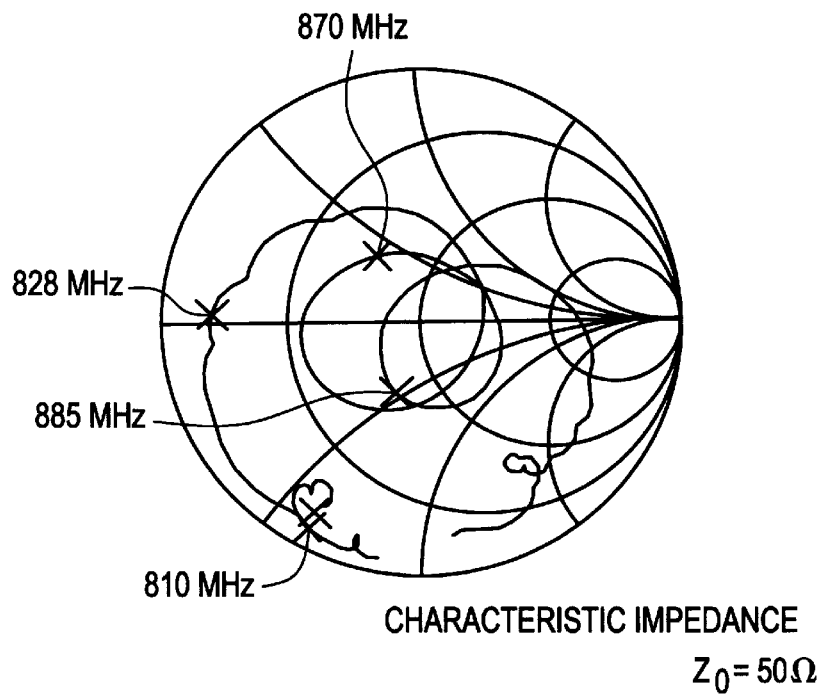
FIG. 12A is an impedance Smith chart for an input end of the first SAW filter 22 in the preferred embodiment shown in FIG. 3.
Figure 12B:
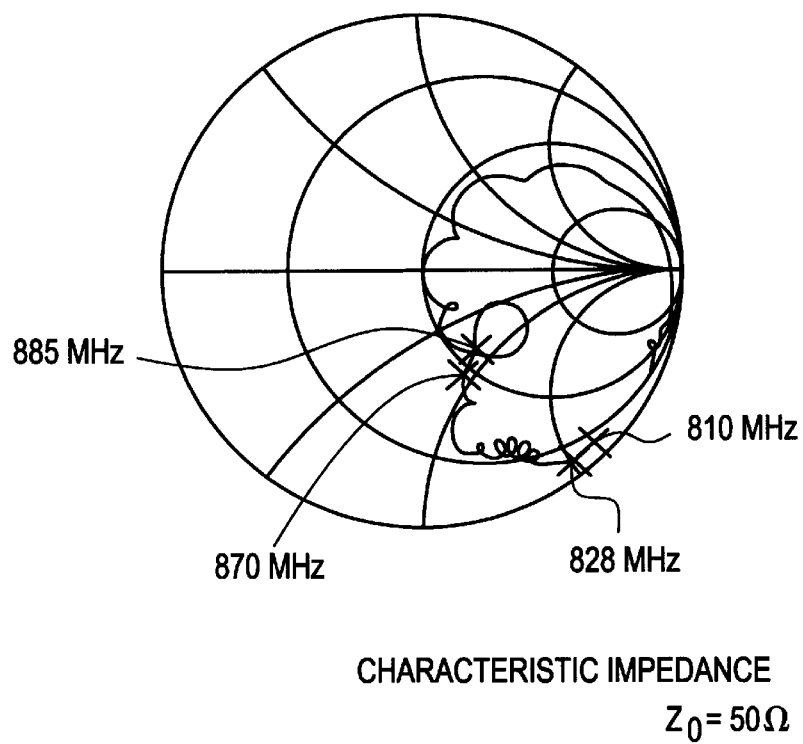
FIG. 12B is an impedance Smith chart for an output end of the first SAW filter 22 in the preferred embodiment shown in FIG. 3.

FIGS. 12A and 12B are impedance Smith charts in the vicinity of the pass band for the input end and the output end respectively of the first SAW filter 22 side.

FIG. 13 shows the frequency-amplitude characteristic in the vicinity of the pass band of the second SAW filter 23 side in which the third SAW resonator 25 is connected to the second SAW filter 23 in series as shown in FIG. 3. A 10 nH inductance device for impedance matching 28 is connected between the parallel connection point 24 and ground, and also the input side of the first SAW filter 22 is terminated with a 50Ω resistance.

It is noted that the frequency-amplitude characteristic shown by the broken line in FIGS. 6, 8, 10 and 11 has been enlarged in accordance with the scale shown on the right side of the vertical axis.

A comparison of FIG. 7B which shows the output side impedance Smith charts of the first SAW filter 22 alone and FIG. 12B which shows the output side impedance Smith charts of the first SAW filter 22 connected with the one-port SAW resonators 26 and 27 reveals that the impedance at about 810 to about 828 MHz is higher. Thus, the series combination of the first SAW filter 22 and the one-port SAW resonators 26 and 27 effectively prevents the signal in the range of about 810 to about 828 MHz, which is within the pass band of the second SAW filter 23, from transmitting therethrough. This is confirmed by the fact that FIG. 13 reveals that good pass band characteristics and attenuation characteristics are obtained on the second SAW filter 23 side.

The aforementioned filter characteristics shown in FIGS. 11, 12A, 12B and 13 of the surface acoustic wave device 21 are further explained by comparing a comparative example with the preferred embodiments of the present invention, so that the improvement of the filter characteristics of the surface acoustic wave device 21 of preferred embodiments of the present invention can be understood more clearly.

Figure 14:
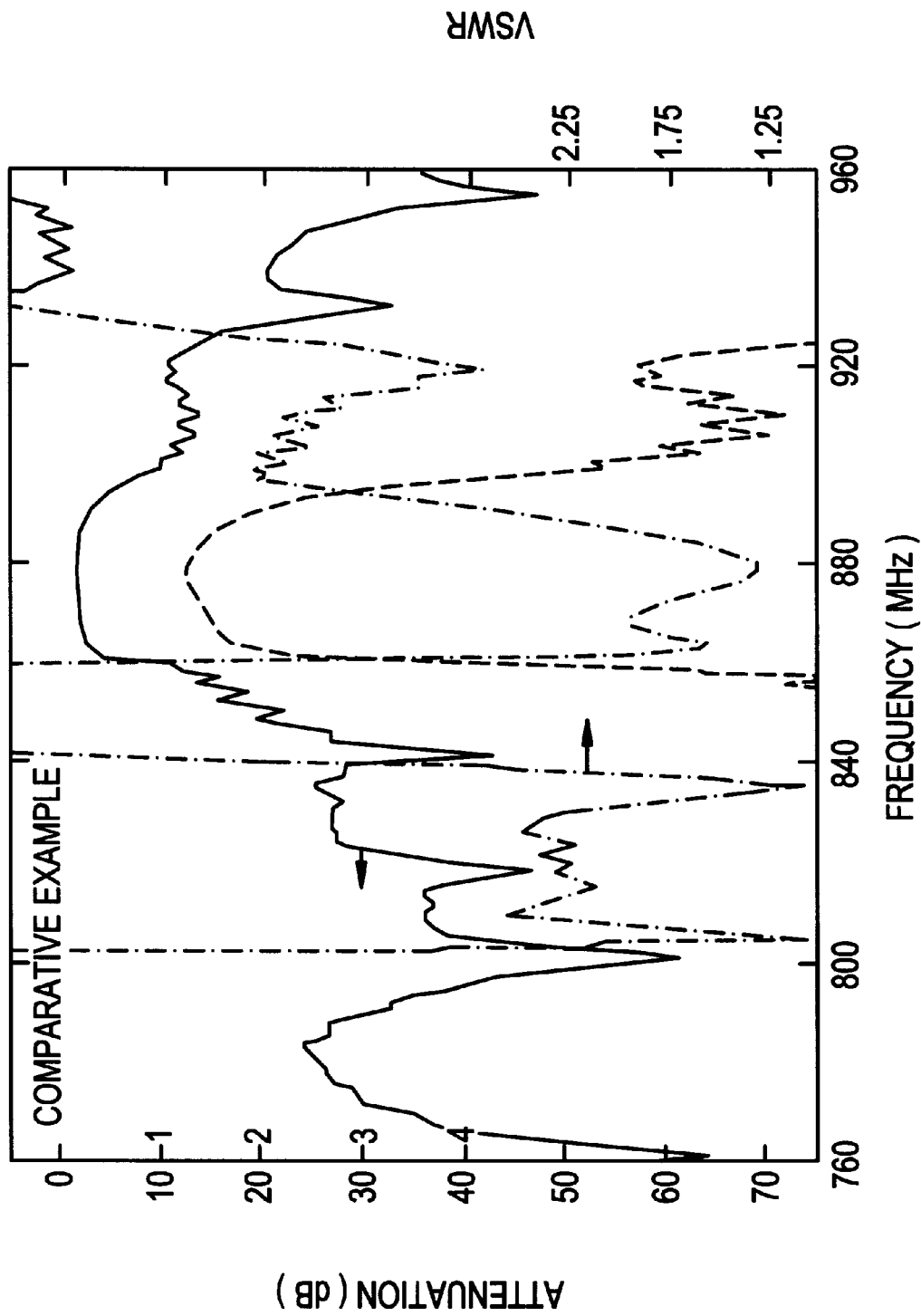
FIG. 14 is a graph showing frequency-amplitude characteristic and VSWR on the first SAW filter side of a surface acoustic wave device prepared for comparison.
Figure 15:
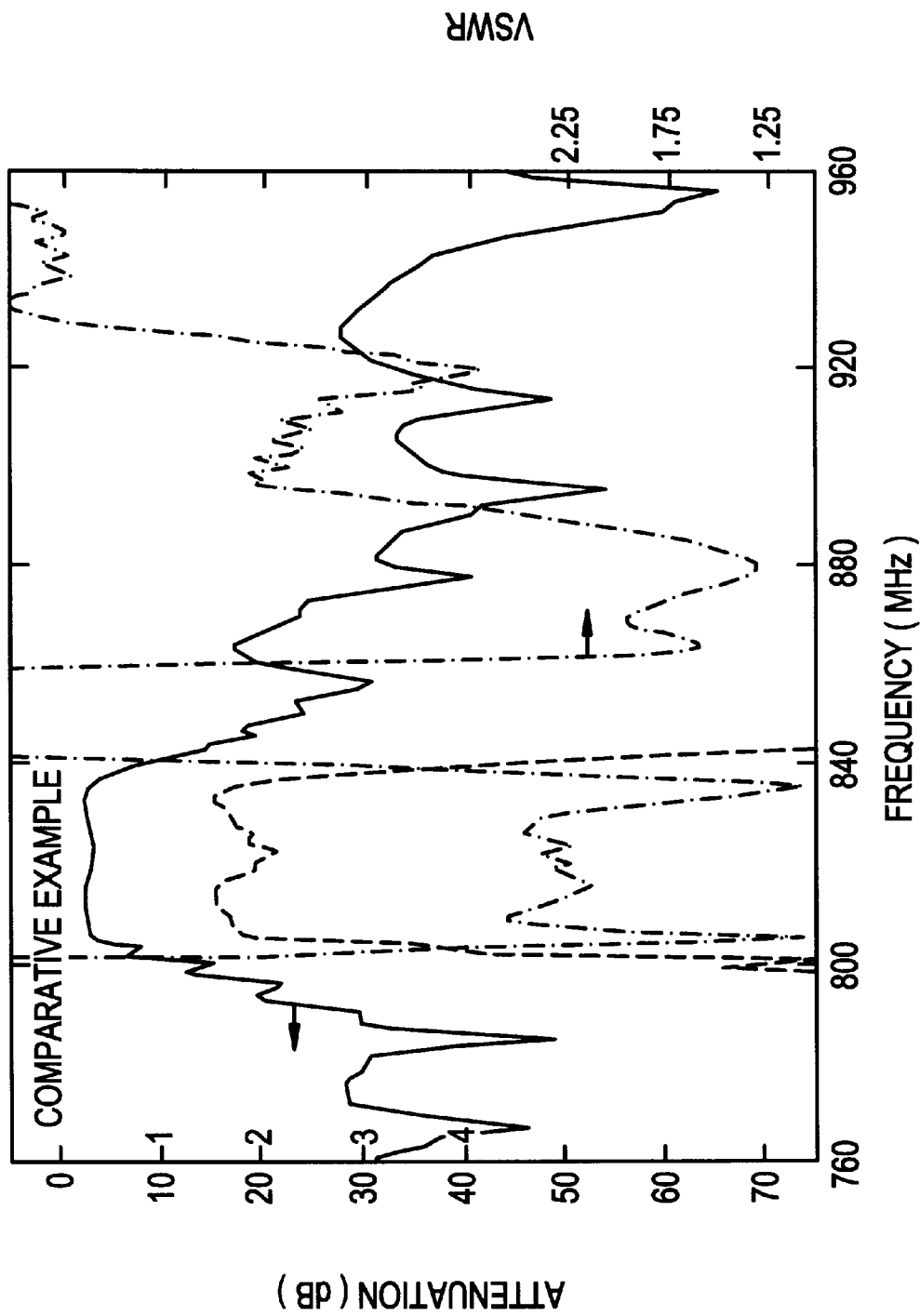
FIG. 15 is a graph showing the frequency-amplitude characteristic and VSWR on the second SAW filter side of a surface acoustic wave device prepared for comparison.

FIGS. 14 and 15 show the frequency-amplitude characteristic in the vicinity of the pass band of a surface acoustic wave device made for comparison to the preferred embodiments of the present invention. Specifically, this surface acoustic wave device for comparison purposes has a construction wherein the output end of the first SAW filter 22 and the output end of the second SAW filter 23 are directly connected in series, and FIGS. 14 and 15 show the frequency-amplitude characteristics in the vicinity of the pass bands on the first SAW filters 22 side and the second SAW filter 23, respectively. A 10 nH inductance device for impedance matching is connected between the connection point of the first and second SAW filters and ground, and the input side of the first SAW filter 22 or the second SAW filter is terminated with a 50Ω resistance when the frequency-amplitude characteristic of the other filter is measured.

As is clear from the comparison of FIG. 11 and FIG. 14, in the frequency-amplitude characteristic shown in FIG. 14, although the deterioration of insertion loss in the first SAW filter is small, it can be seen that the VSWR in the pass band becomes large and that the amount of attenuation on the high-frequency side of the pass band is small.

Also, as is clear from the comparison of FIG. 13 and FIG. 15, in FIG. 15, it can be seen that the insertion loss in the second SAW filter 23 is large.

As is apparent from the aforementioned explanation, according to the surface acoustic wave device of preferred embodiments of the present invention, the impedance of the first SAW filter in the pass band of the second SAW filter is increased by the first one-port SAW resonator and the impedance of the second SAW filter in the pass band of the first SAW filter is increased by the second one-port SAW resonator. Therefore, deterioration of insertion loss of the first and second SAW filters is suppressed and an increase in the amount of attenuation on the high-frequency sides of the respective pass bands is achieved. Further, it is possible to suppress deterioration of insertion loss and deterioration of VSWR in the pass band.

Figure 1:
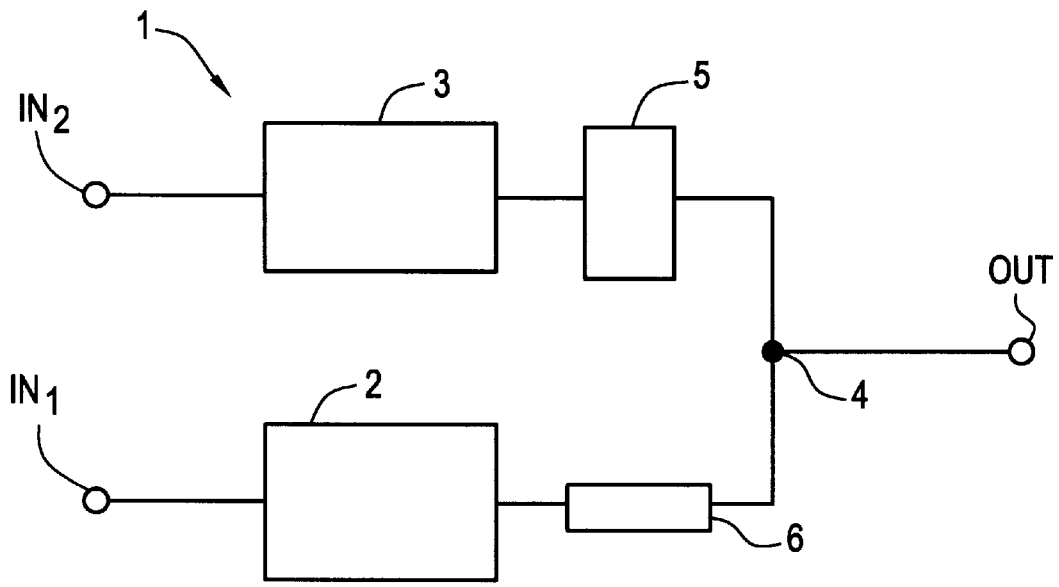
FIG. 1 is a circuit diagram showing a conventional surface acoustic wave device.
Figure 2:
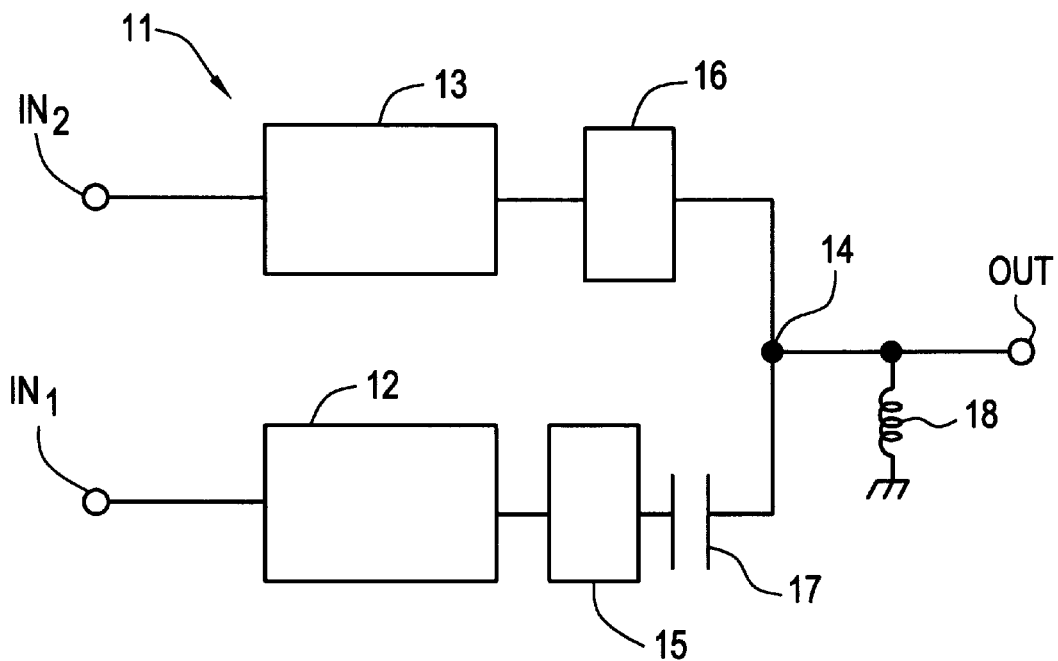
FIG. 2 is a circuit diagram showing another conventional surface acoustic wave device.
Figure 16:
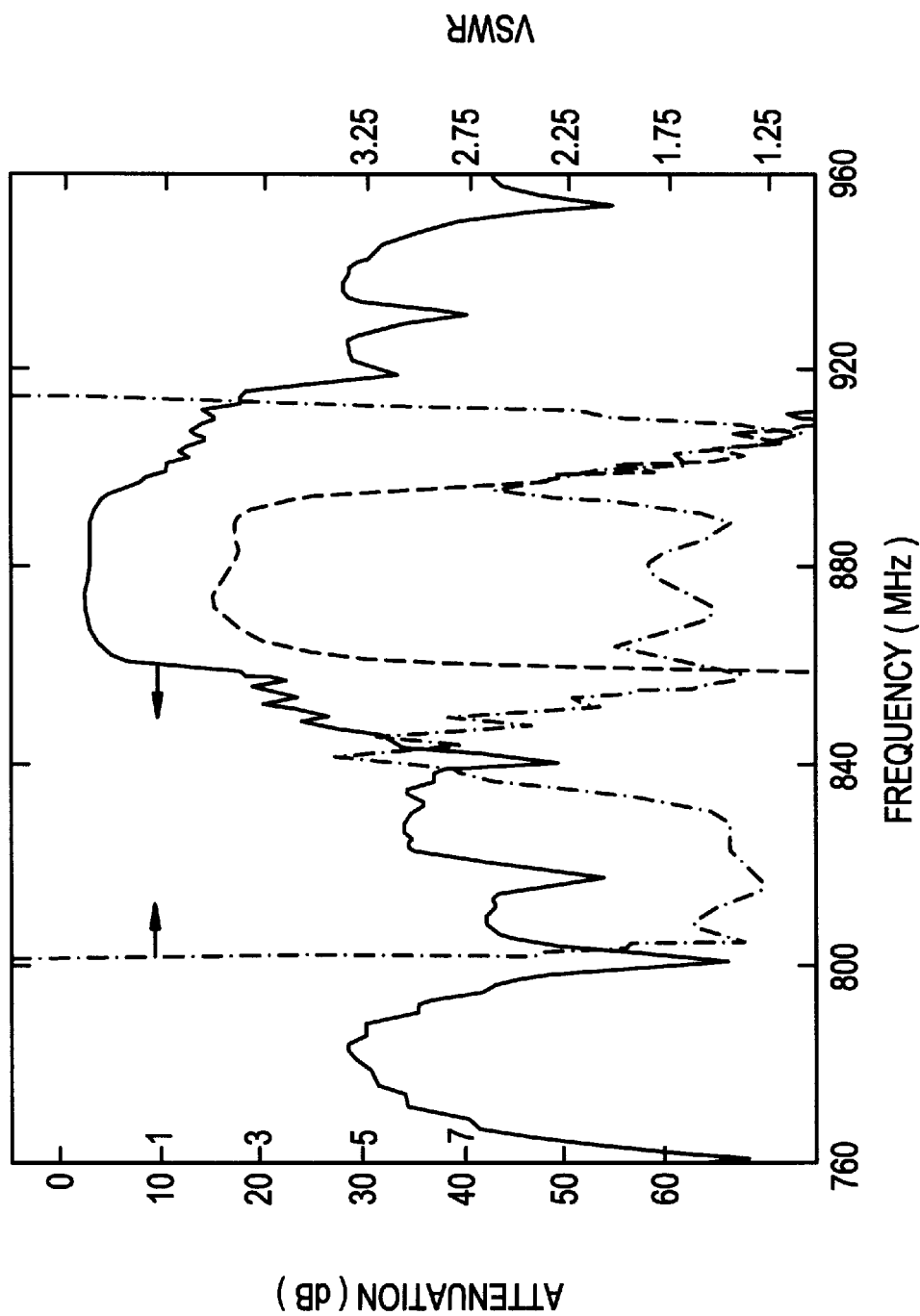
FIG. 16 is a graph showing the frequency-amplitude characteristic and VSWR of in the vicinity of the pass band on the first SAW filter side in the surface acoustic wave device shown in FIG. 2.
Figure 17A:
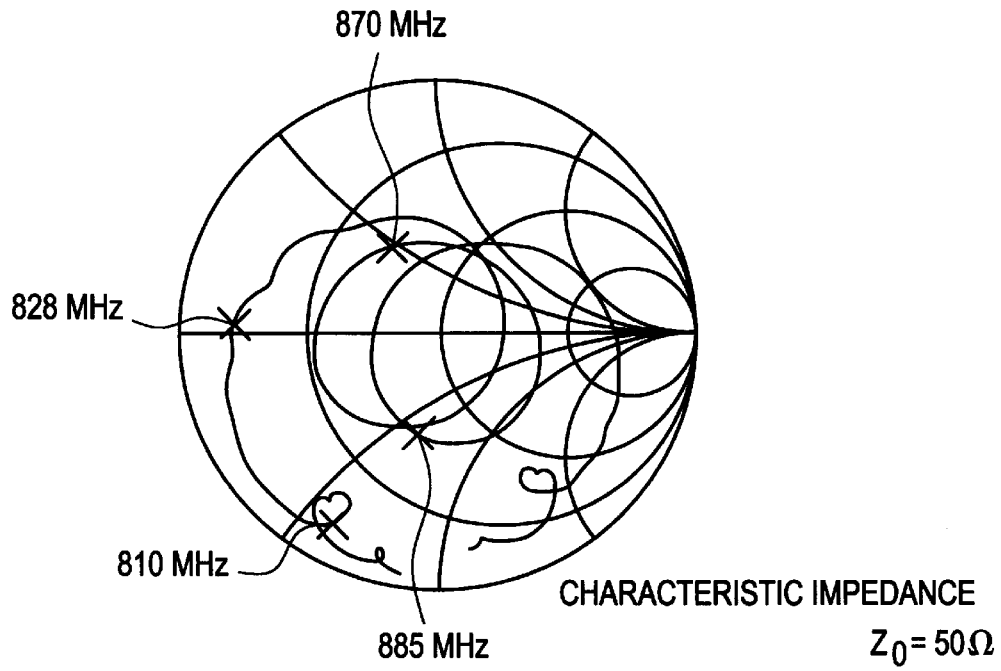
FIG. 17A is an impedance Smith chart of inside the pass band of a case wherein, in the surface acoustic wave device shown in FIG. 2, a one-port SAW resonator is connected and also a capacitor is connected in series to the output side of the first SAW filter.
Figure 17B:
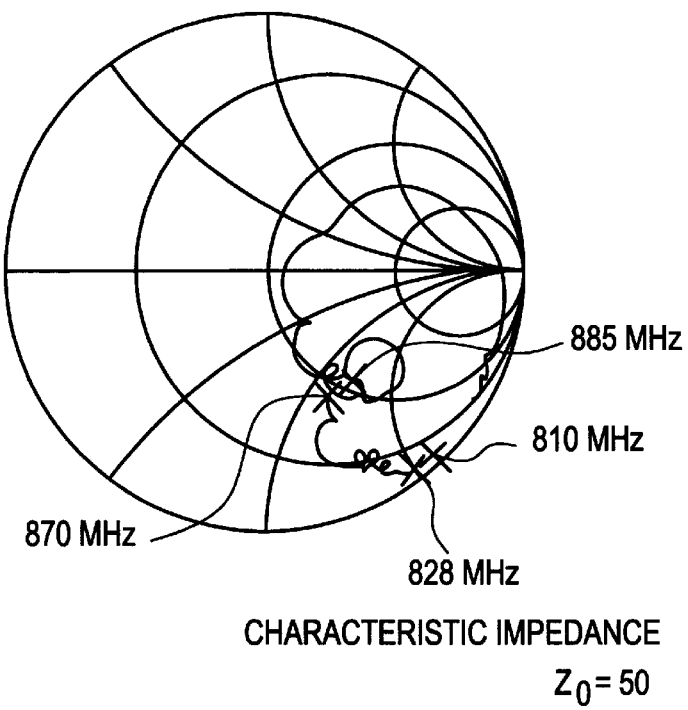
FIG. 17B is an impedance Smith chart of outside the pass band of a case wherein, in the surface acoustic wave device shown in FIG. 2, a one-port SAW resonator is connected and also a capacitor is connected in series to the output side of the first SAW filter.

FIG. 16 is a frequency-amplitude characteristic in the vicinity of the pass band on the first SAW filter 12 side in the conventional surface acoustic wave device 11 shown in FIG. 2. A 10 nH inductance device for impedance matching 18 is connected between the parallel connection point 14 and ground potential, and also the input side of the second SAW filter 13 is terminated with a 50Ω resistance. FIGS. 17A and 17B show impedance Smith charts in the vicinity of the pass band of the input side and the output side respectively of the one-port SAW resonator 15 with the series capacitor 17 of 5.5 pF.

As is clear from the comparison of FIG. 11 and FIG. 16, it is seen that in the surface acoustic wave device of the present preferred embodiment shown in FIG. 3, by using a one-port SAW resonator only, compared to the conventional example in which a SAW filter and a capacitor are used, insertion loss can be suppressed to the same level or below. Also, it can be seen that in the surface acoustic wave device of this preferred embodiment, the VSWR in the pass band is small compared to the conventional example, and the difference is 0.5. Also, in the frequency-amplitude characteristic of the surface acoustic wave device of this preferred embodiment shown in FIG. 11, it is understood that the amount of attenuation on the high-frequency side in the pass band also is about 3 dB greater compared with the case of the conventional example shown in FIG. 16.

In addition, FIG. 17B reveals that as a result of the one-port SAW resonator 15 and the capacitor 17 being connected, the impedance at about 810 to about 828 MHz is high, like the case of the impedance Smith chart shown in FIG. 12B according to preferred embodiments of the present invention. However, the impedance Smith chart shown in FIG. 17B indicates that the impedance of the pass band shifts greatly from the 50Ω pure resistance toward the capacitive impedance compared to the case of the impedance Smith chart shown in FIG. 12B.

As is clear from the aforementioned explanation, the surface acoustic wave device according to preferred embodiments of the present invention achieves greatly increased improvement in deterioration of insertion loss and VSWR in the pass band than the surface without using a capacitor which requires a large area of the piezoelectric substrate.

Although in the aforementioned example of preferred embodiments of the present invention, the SAW resonators 26 and 27 have the same characteristics, the SAW resonators 26 and 27 may have different characteristics so as to further improve the filter characteristics of the surface acoustic wave device 21 according to preferred embodiments of the present invention.

Figure 18:
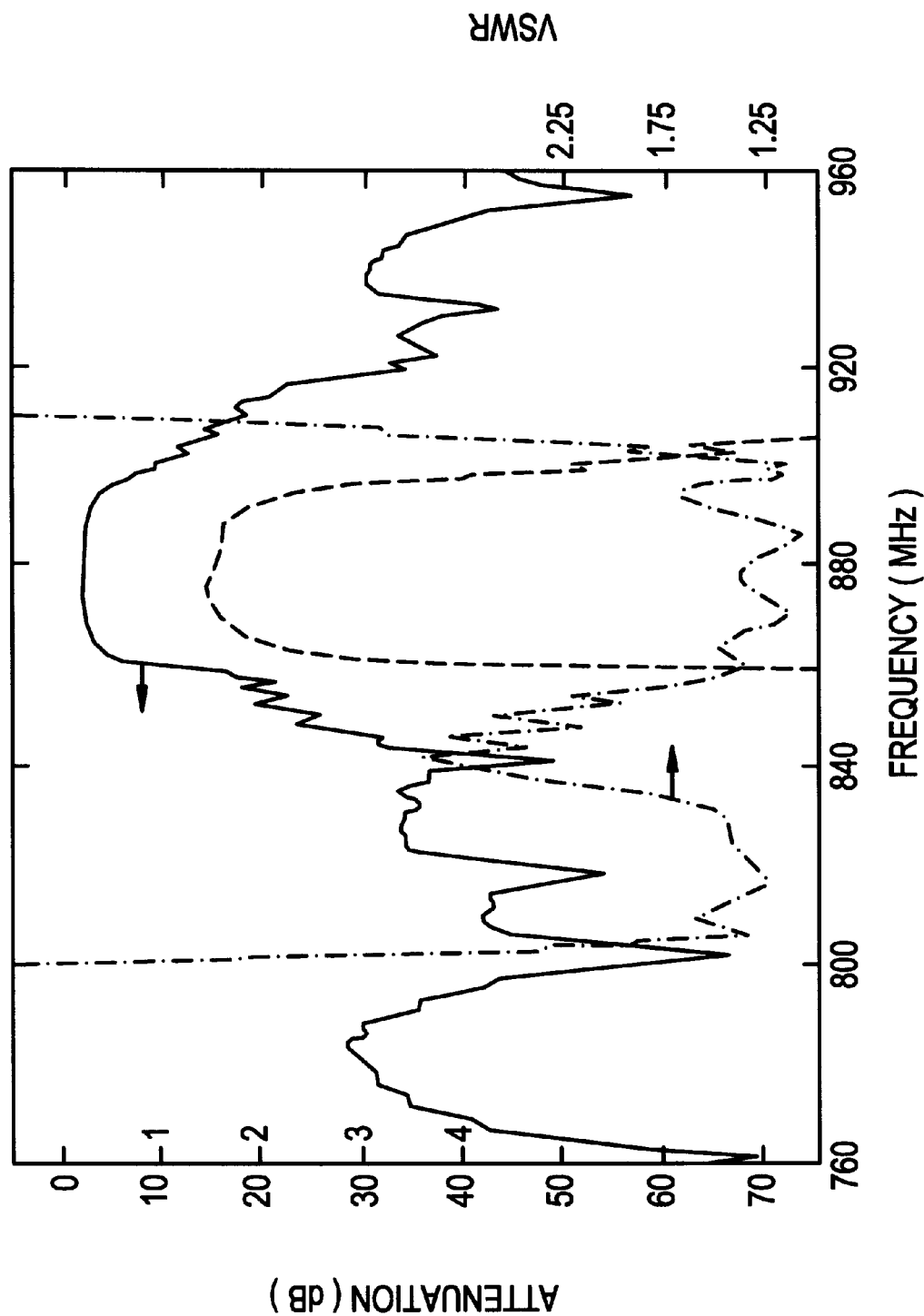
FIG. 18 is a graph showing frequency-amplitude characteristic and VSWR on the first SAW filter side according to the preferred embodiment shown in FIG. 3 in which the two one-port SAW resonators have different frequency characteristics.

FIG. 18 is a frequency-amplitude characteristic in the vicinity of the pass band on the first SAW filter side in the case where the characteristics of the SAW resonators 26 and 27 are different in the surface acoustic wave device 21 shown in FIG. 3. More specifically, the wavelength of the surface acoustic wave excited by the IDT of one of the one-port SAW resonators 26 and 27 is made different from that of the IDT of the other one-port SAW resonator so that the difference in wavelength between the one-port SAW resonators 26 and 27 is set at 2.5 MHz.

As is seen from FIG. 18 and FIG. 10, FIG. 14 shows that the ripple inside the pass band is reduced compared to FIG. 10. In the one-port SAW resonator, a ripple occurs in the pass band of the first SAW filter 22 due to the influence of the reflectors provided on both sides of the IDT. When the one-port SAW resonators 26 and 27 having the same characteristics are connected in series to make a two-stage construction, this ripple appears more strongly. To overcome this, in the modified example shown in FIG. 18, the frequency of the above-mentioned ripple generated by the one-port SAW resonator 26 is shifted with respect to the frequency of the ripple generated by the one-port SAW resonator 27 by making the wavelengths of the surface acoustic waves excited by the IDTs of the one-port SAW resonators 26 and 27 to be different, whereby the ripple in the pass band is reduced. The wavelength of the surface acoustic wave excited is changed by adjusting the interval and/or the width of the electrode fingers of the IDTs of the one-port SAW resonators 26 and 27. In this modified example, the wavelengths of the surface acoustic waves excited at the one-port SAW resonators 26 and 27 are different but instead of this, or in addition to this, the number of electrode fingers of the reflectors of the one-port SAW resonator 26 can be different from the number of electrode fingers of the reflectors of the one-port SAW resonator 27, and it is possible to similarly reduce the ripple in the pass band.

Figure 19:
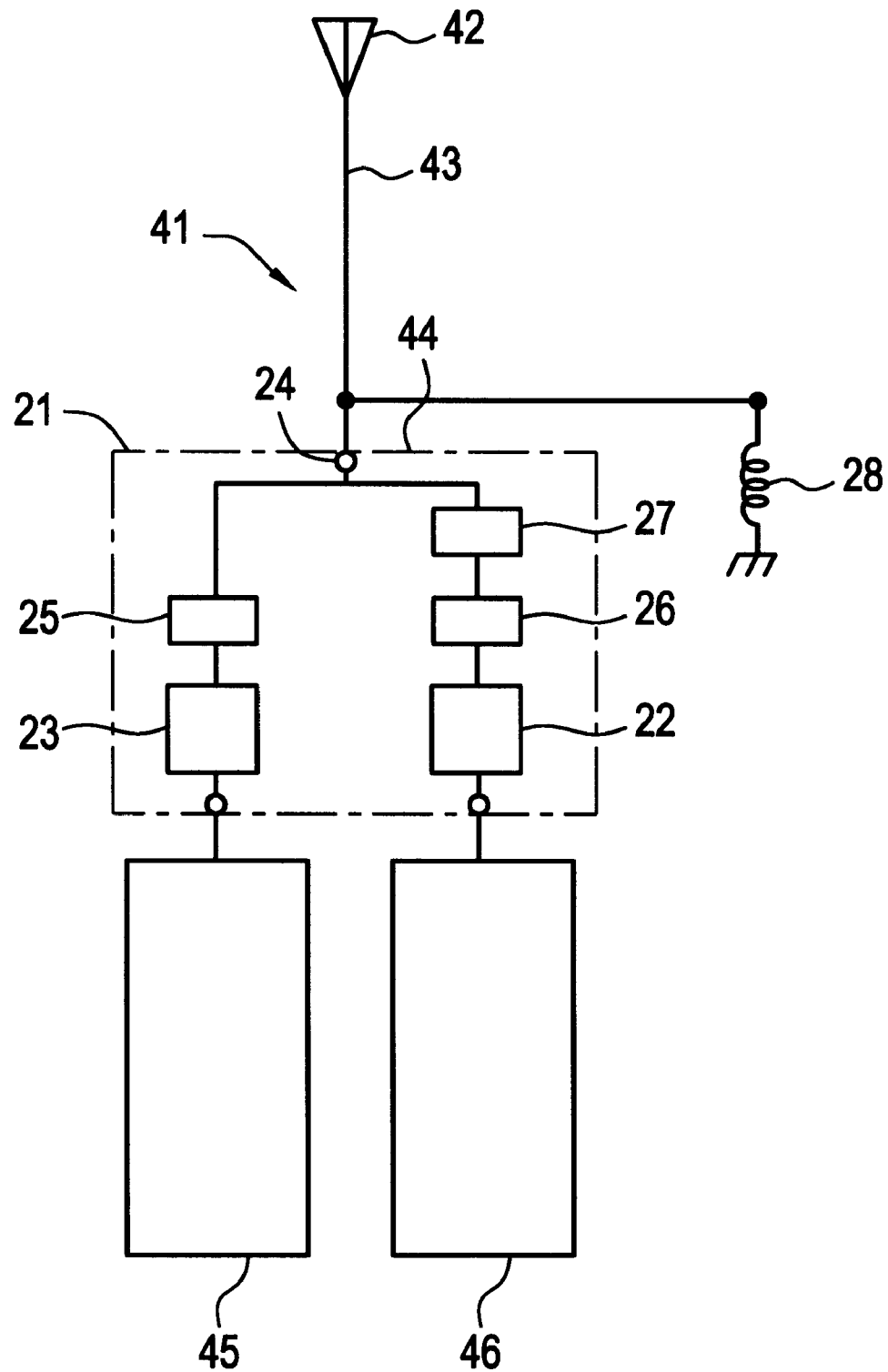
FIG. 19 is a diagram showing a communication apparatus according to another preferred embodiment of the present invention.

The surface acoustic wave device of preferred embodiments of the present invention can be suitably applied to various kinds of communication apparatuses to receive and/or transmit signals within two different frequency bands. FIG. 19 shows a diagram of one example of such a communication apparatus according to another preferred embodiment of the present invention. A communication apparatus 41 shown in FIG. 19 comprises an antenna 42, a surface acoustic wave device 21 and first and second circuits 45 and 46. The surface acoustic wave device 21 is preferably the same as the surface acoustic wave device 21 shown in FIG. 3, and the connection point 24 of the surface acoustic wave device 21 is connected to the antenna 42 through a transmission line 43. The first and second circuits 45 and 46 are either a receiver circuit or a transmitter circuit, and connected to the second and first SAW filters 23 and 22, respectively. In the case where both of the first and second circuits 45 and 46 are a receiver circuit or a transmitter circuit, the communication apparatus 41 is a dual band receiver or transmitter. In the case where one of the first and second circuit 45 and 46 is a transmitter circuit and the other is a receiver circuit, the communication apparatus 41 is a transceiver.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a first SAW filter having first and second ends and a first pass band in a first frequency region;
   a second SAW filter having first and second ends and a second pass band in a second frequency region which is lower than the first frequency region, the second end of the second SAW filter being connected to the second end of the first SAW filter in parallel to define a connection point;
   first and second one-port SAW resonators connected in series between the second end of the first SAW filter and the connection point, the first and second one-port SAW resonators having an antiresonant frequency higher than the frequency of the pass band of the first SAW filter, the first and second one-port SAW resonators including a pair of reflectors having a plurality of electrode fingers, respectively, and a number of the electrode fingers of the first one-port SAW resonators is different from that of the second one-port SAW resonator; and
   a third one-port SAW resonator connected in series between the second end of the second SAW filter and the connection point, the third one-port SAW resonator having an antiresonant frequency higher than the frequency of the pass band of the second SAW filter.

2. A surface acoustic wave device according to claim 1, wherein the first and second one-port SAW resonators include interdigital transducers, respectively, and a wavelength of a surface acoustic wave excited by the interdigital transducer of the first one-port SAW resonator is different from that of the interdigital transducer of the second one-port SAW resonator.

3. A surface acoustic wave device according to claim 1, further comprising a single piezoelectric substrate, wherein the first and second SAW filters and the first, second and the third one-port SAW resonators are disposed on the single piezoelectric substrate.

4. A communication apparatus comprising:
   a surface acoustic wave device including a first SAW filter having first and second ends and a first pass band in a first frequency region, a second SAW filter having first and second ends and a second pass band in a second frequency region which is lower than the first frequency region, the second end of the second SAW filter being connected to the second end of the first SAW filter in parallel to define a connection point, first and second one port SAW resonators connected in series between the second end of the first SAW filter and the connection point, the first and second one port SAW resonators having an antiresonant frequency higher than the frequency of the pass band of the first SAW filter, and a third one-port SAW resonator connected in series between the second end of the second SAW filter and the connection point, the third one-port SAW resonator having an antiresonant frequency higher than the frequency of the pass band of the second SAW filter, the first and second one-port SAW resonators including a pair of reflectors having a plurality of electrode fingers, respectively, and a number of electrode fingers of the first one-port SAW resonators is different from that of the second one-port SAW resonator;
   an antenna connected to the connection point of the surface acoustic wave device; and
   first and second circuits respectively connected to the first ends of the first and second SAW filter of the surface acoustic wave device, wherein the first and second circuits are one of a receiving circuit and a transmitting circuit.

5. The communication apparatus according to claim 4, wherein the first and second one-port SAW resonators include interdigital transducers, respectively, and a wavelength of a surface acoustic wave excited by the interdigital transducer of the first one-port SAW resonator is different from that of the interdigital transducer of the second one-port SAW resonator.

6. The communication apparatus according to claim 4, further comprising a single piezoelectric substrate, wherein the first and second SAW filters and the first, second and the third one-port SAW resonators are disposed on the single piezoelectric substrate.

* * * * *